United States Patent
Ho et al.

(10) Patent No.: US 6,355,530 B1
(45) Date of Patent: Mar. 12, 2002

(54) METHOD OF MANUFACTURING A MASK ROM BIT LINE

(75) Inventors: James Ho, Taichung; Cheng-Hui Chung, Hsinchu Hsien; Chen-Bin Lin, Taipei, all of (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/630,867

(22) Filed: Aug. 2, 2000

(30) Foreign Application Priority Data

Jul. 6, 2000 (TW) ........................... 89113381 A

(51) Int. Cl.⁷ .......................................... H01L 21/8236
(52) U.S. Cl. ..................... 438/276; 438/275; 438/277; 438/278; 438/558
(58) Field of Search ................................ 438/275–278, 438/558–559

(56) References Cited

U.S. PATENT DOCUMENTS 4,490,193 A  * 12/1984 Ishaq et al. ................. 148/188
5,086,016 A  *  2/1992 Brodsky et al. ............. 438/369
5,940,712 A  *  8/1999 Prall et al. ................... 438/382

FOREIGN PATENT DOCUMENTS

| DE | 3243125 | * 5/1984 | ........... H01L/21/18 |
| JP | 03071626 | * 3/1991 | ........... H01L/21/28 |

* cited by examiner

Primary Examiner—Charles Bowers
Assistant Examiner—Thanh Nguyen
(74) Attorney, Agent, or Firm—Thomas, Kayden, Horstemeyer & Risley

(57) ABSTRACT

A method of manufacturing a mask ROM. A sacrificial silicon oxide layer is formed on the active region upon the substrate. Patterning the sacrificial silicon oxide layer in order to form a plurality of parallel openings, thereby exposing a portion of the active region. A polysilicon layer is formed on the openings and openings are formed thereon. An ion implantation process is performed on the polysilicon layer. Using a thermal flow process, the ions within the polysilicon layer are driven through the openings into the lower portion of the substrate, thereby forming an ion doping region. The polysilicon layer is etchbacked until the sacrificial silicon oxide layer is exposed. The sacrificial silicon oxide layer is removed.

16 Claims, 2 Drawing Sheets

METHOD OF MANUFACTURING A MASK ROM BIT LINE

CROSS-REFERENCE TO RELATED APPLICATION

This application claims the priority benefit of Taiwan application Ser. No. 89113381, filed Jul. 6, 2000.

BACKGROUND OF THE INVENTION

1. Field of the Invention

The present invention relates to a method of manufacturing of a bit line. More particularly, the present invention relates to a method of manufacturing which uses a graded buried junction to suppress the punch-through of a memory cell bit line (BL) and the leakage increase of a mask ROM BL.

2. Description of the Related Art

Currently, ROM designs have been restricted by the technology of semiconductor manufacturing, and the reduced measurements of the ROM device requires further improvements in manufacturing techniques. The ROM in the related art is made of an array of field effect transistors (FET). Each memory cell includes a single FET device and each FET device provides one of the two set values as a special transistor characteristic.

The generally used mask ROM utilizes a channel transistor as a memory cell, and selectively implant ions into the specified channel regions in the programming stage. By changing the threshold voltage, it controls the on/off function of the memory cell. The structure of the mask ROM is a polysilicon word line (WL) which intersects with the BL almost perpendicularly. The channel of the memory cell forms on the covered lower portion of the WL and the region between the BLs. This selective transistor with special characteristics utilizes the difference of the transistor threshold voltage. When there are implant impurities in the channel region of the transistor, it causes the transistor to have a relatively low threshold voltage, then a voltage Vcc is applied to the gate and causes the channel to open. If the channel region of the transistor does not have implant impurities, then the transistor has a relatively high threshold voltage, which also means that the channel is not opened by the voltage Vcc that has been applied to the gate. Therefore, the binary data selectively implants impurities into the channel region of the transistor to store into the ROM. When the channel region of the transistor implants impurities, it is stored as logic value '0'; as the channel region does not have implant impurities, it is stored as logic value '1'.

Presently, the implementation of memory transistors is limited in the technique of the design rules, moreover consideration of the device design is also limited to the degree of stored materials that the ROM in the related art is capable of increasing. For example, the ROM in the related art, uses buried N+ type lines (itself or also with the source/drain and BL) to connect to a source/drain diffusion region of a row of transistors. These connecting N+ lines become decreasingly small as the design rules decrease. After the integration rate of the device becomes increasingly high, since this type of buried BL has no way of effectively lowering resistance, thus, it prevents the ROM from operating at an even higher speed. The most important reason is that in the doping of the high concentration of the N+ type ion, resistance is only lowered to about 70 to 80 ohm-cm. If in order to lower the resistance, the quantity of ion implantation continues to increase, a punch-through of the memory cell BL results. Furthermore, if the doping concentration of the N+ type ion is increased, the junction forms a leakage increase. Hence, this type of mask ROM buried BL manufacturing, is only suitable for use on procedures from about $0.45\mu$ to $0.5\mu$. If the integration rate of the mask ROM increases, then the related art procedure is not suitable, and requires the development of a new procedure.

SUMMARY OF THE INVENTION

Accordingly, the present invention provides a method of manufacturing ROM BL. The method of ion implantation is no longer utilized to form a buried mask ROM BL, but rather, a sacrificial silicon oxide layer is formed on the active region delimited by a field oxide (FOX) layer. Numerous parallel openings are formed on the sacrificial silicon oxide layer. A polysilicon layer which includes the several parallel openings, is formed upon the sacrificial silicon oxide layer. The polysilicon layer which is formed on the sacrificial silicon oxide layer performs ion implantation. For example, the thickness of the polysilicon layer formed by the low pressure chemical vapor deposition (LPCVD) is from about 1000 Å to 3000 Å, and the concentration of the implanted ions is from about $10^{14}$ to $10^{17}$ atoms/cm$^2$. The ion subsequently undergoes a thermal procedure via the sacrificial silicon oxide layer drive-in opening of the silicon substrate, and forms an ion concentration into a graded buried junction. The nearer the ions are to the openings of the sacrificial silicon oxide layer, the higher the concentration, and conversely, the further away the ions are, the lower the concentration. Moreover, the polysilicon layer is etched back and the sacrificial silicon oxide layer is removed to form the BL. A gate oxide layer, a polysilicon layer, a silicide layer and a photoresist are sequentially formed upon the polysilicon layer and the substrate. The photoresist is patterned and then selectively etchbacks the exposed silicide layer and the polysilicon layer, and also selectively etchbacks the gate oxide layer. The photoresist layer is removed to form a gate, and is used as a WL.

According to the procedure provided in the present invention, a doped polysilicon conductive wire formed on the substrate, and an ion doping region located in the lower portion of the doped polysilicon conductive wire, form a BL together. Since the conductive wire is located on the surface of the substrate, there is no need to worry that high concentration doping causes the BL to be punched through. Therefore, it performs high concentration doping of the doped polysilicon conductive wire to lower BL resistance. Moreover, by using a thermal flow procedure to dope polysilicide BL ions and drive them into the substrate to form an arched diffusion, the ions concentrate into a graded buried junction. When the high ion concentration of the shallow junction lowers the junction resistance, and the low ion concentration of the deep junction reduces leakage, the side junction low ion concentration prevents a punch-through from occurring.

As embodied and broadly described herein, one of the objectives of the present invention is to provide a method of manufacturing a mask ROM BL. The present manufacturing procedure uses a doped polysilicon layer of the openings of a sacrificial silicon oxide layer and the buried junction of the lower portion to form a BL.

Another objective of the present invention is to provide a method of manufacturing a mask ROM BL. The present manufacturing procedure utilizes a sacrificial silicon oxide layer as a mask. Via a thermal flow procedure through the openings of the sacrificial silicon oxide layer, the doped ions in the polysilicon layer are driven into the substrate and form a buried junction.

Yet another objective of the present invention is to provide a method of manufacturing a mask ROM BL. The present manufacturing procedure is that a buried junction of a graded ion concentration with an arched diffusion is formed on the lower portion of a doped polysilicon BL. The closer it is to the center of the arc, the higher the ion concentration; conversely, the further away it is from the center of the arc, the lower the ion concentration.

A another objective of the present invention is to provide a method of manufacturing a mask ROM BL. The present manufacturing procedure lowers the BL resistance and utilizes the junction of the graded ion concentration arched diffusion in order to prevent the a punch-through of the BL from happening. Moreover, the low concentration of ion doping on the edge of the arc reduces the incidence of leakage.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention, and, together with the description, serve to explain the principles of the invention. In the drawings.

DESCRIPTION OF THE PREFERRED EMBODIMENTS

Figure 1A:
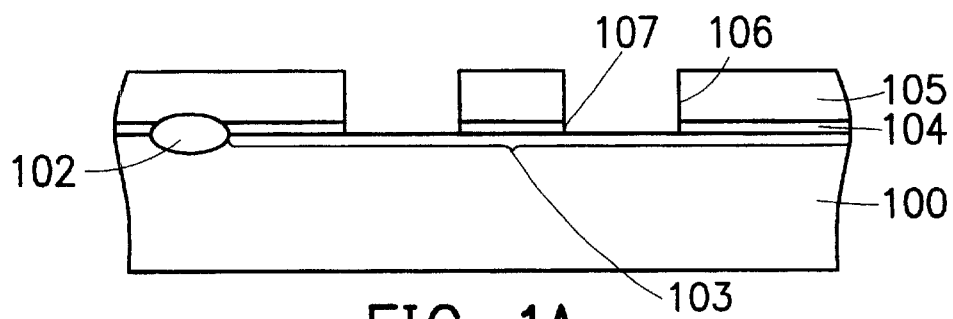
FIGS. 1A to 1D is an X-axis view illustrating a method of manufacturing a mask ROM BL, according to one preferred embodiment of this invention.
Figure 1B:
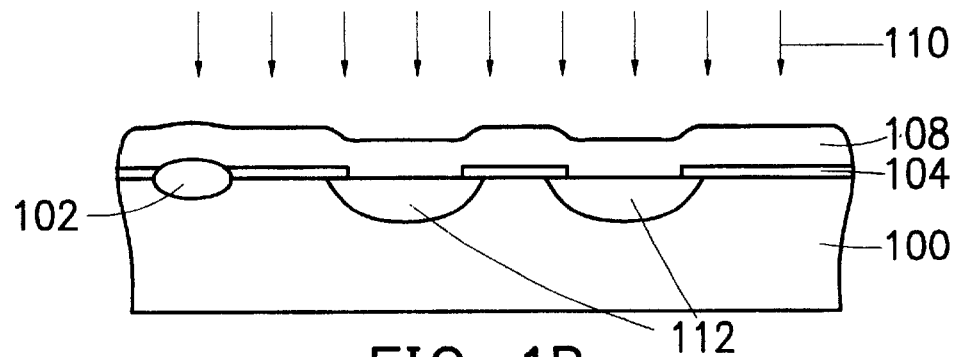

Referring to FIG. 1A, a sacrificial silicon oxide layer 104, which is formed by a procedure such as chemical vapor deposition (CVD), and a photoresist layer 105 are formed upon the substrate 100 within an active region 103 demarcated by a field oxide (FOX) layer 102. The patterned photoresist layer 105, which is formed by a procedure such as lithography, forms the photoresist layer opening 106. By using the photoresist layer 105 as a mask for etching the sacrificial silicon oxide layer 104 to form an opening 107, thereby exposing the lower portion of the substrate 100. The opening 107 is formed by a procedure that includes anisotropic etching, such as reactive ion etching Referring to FIG. 1B, the photoresist layer 108 is removed. Upon the sacrificial silicon oxide layer 104 and the opening 107 are formed a polysilicon layer 108. The polysilicon layer 108 is formed by a procedure that includes CVD, measuring from about 1500 Å to 2000 Å. The polysilicon layer 108 undergoes ion implantation, and the implanted ion concentration is from about $10^{15}$ to $10^{16}$ atoms/cm$^2$. A thermal procedure is subsequently performed so that the ions are driven into the substrate 100 via the opening 107, thereby forming the ion doping region 112. The ion doping region 112 includes an arched junction, and the closer the ions are to the opening 107, the greater the concentration. Conversely, the further away the ions are from the opening 107, the lower the concentration.

Figure 1C:
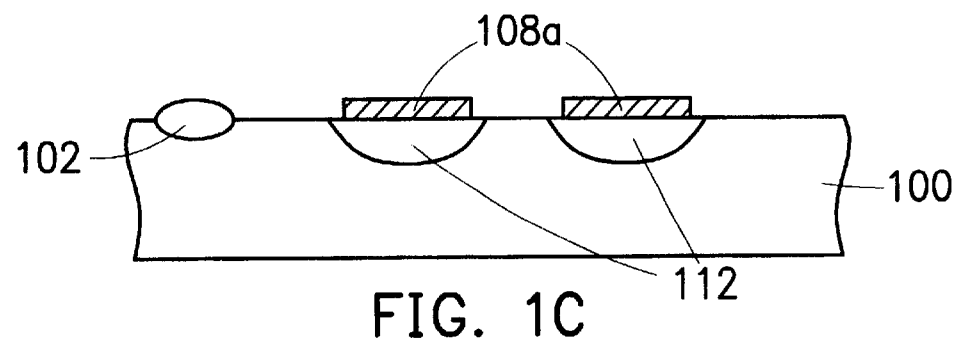

Referring to FIG. 1C, the sacrificial silicon oxide layer 104 is a stop layer used to etchback the polysilicon layer 108. Next, the sacrificial silicon oxide layer 104 is removed and forms a polysilcon layer 108a. The polysilicon conductive wire 108a and the ion doping region 112 form the BL of the present mask ROM.

Figure 1D:
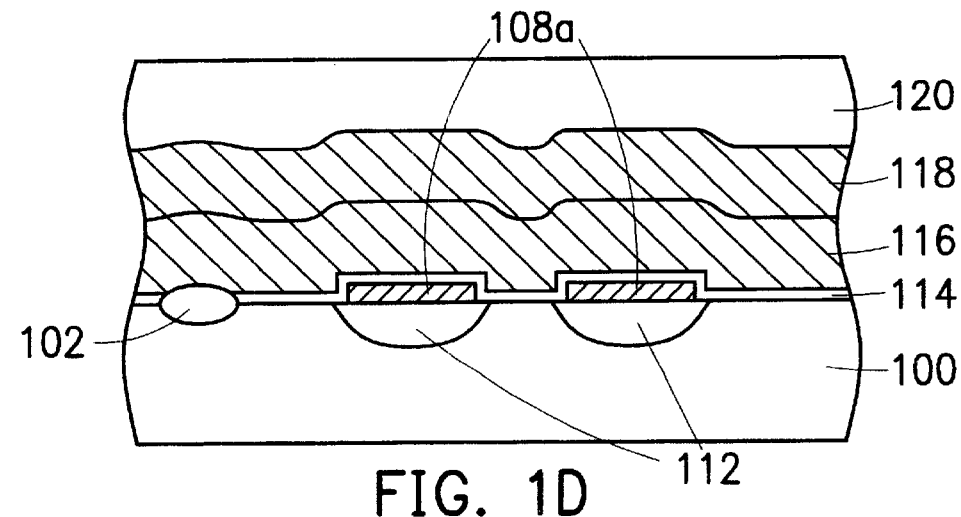

Referring to FIG. 1D, a gate oxide layer 114, a polysilicon layer 116, a silicide layer 118 and a photoresist layer 120 are formed upon the surface of the polysilicon conductive wire 108a and the substrate 100. The gate oxide layer 114 is formed by a procedure that includes thermal oxidation. The polysilicon layer 116 is formed by a procedure that includes CVD. The silicide layer 118 is formed by a procedure that includes LPCVD, and is made from a material such as tungsten silicide ($WSi_x$).

Figure 1E:
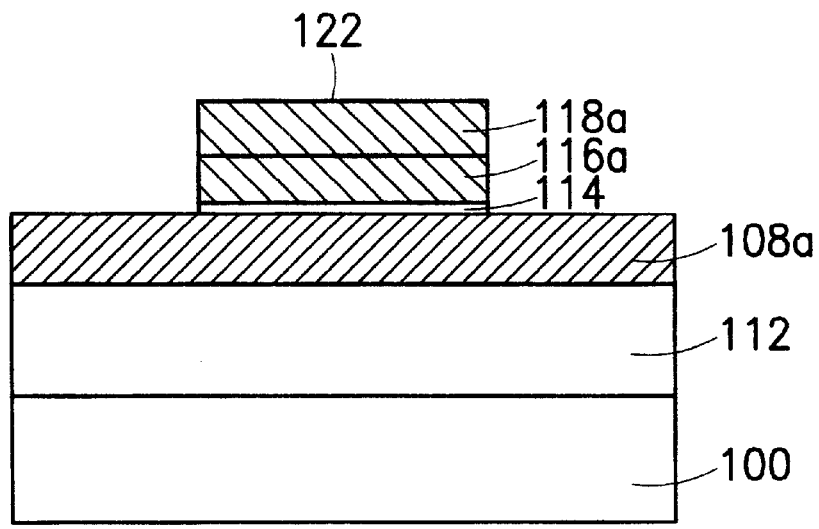
FIG. 1E is a Y-axis view illustrating a a mask ROM, according to second preferred embodiment of this invention.
Figure 1F:
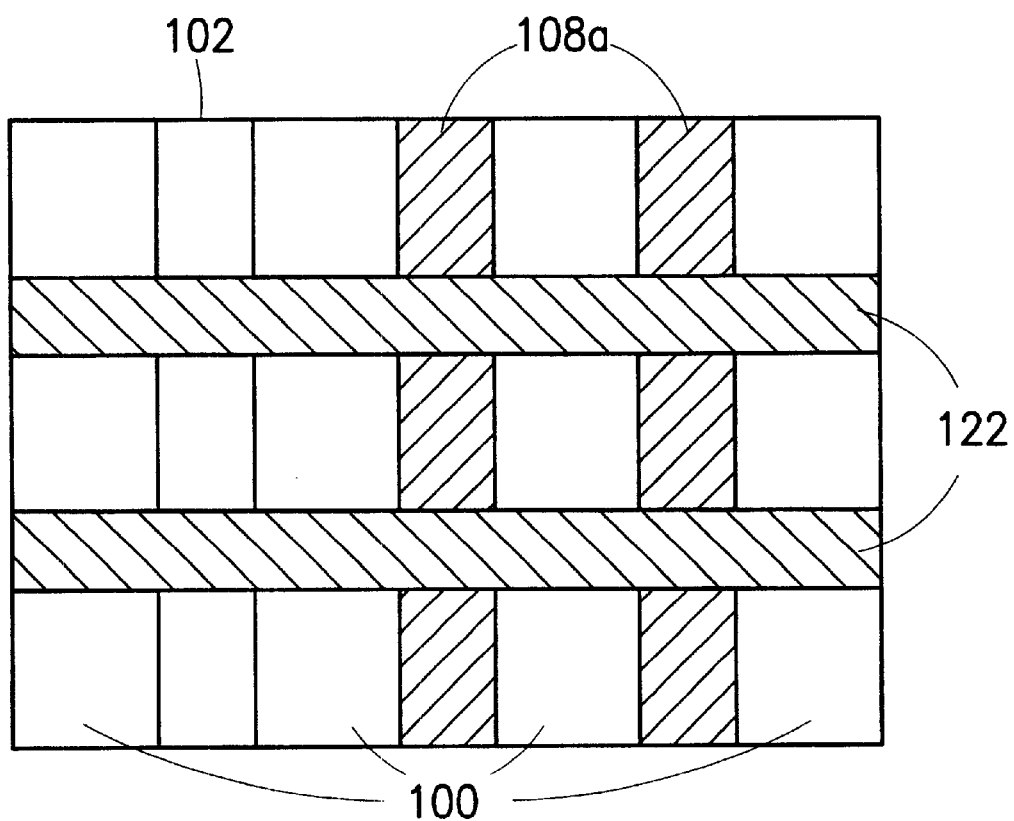
FIG. 1F is a top-view illustrating a mask ROM, according to a third preferred embodiment of this invention.

Referring to FIG. 1E, by using the gate oxide layer 114 as a stop layer, the patterned silicide 118 and the polysilicon layer 116 form the polysilicon gate 116a and silicide gate layer 118a. This patterning is formed by a procedure that includes lithography and an anisotropic etching such as RIE. Next, through selective etchback of the gate oxide layer 114, the photoresist layer is removed to gate 122.

Consequently, according to the method of manufacturing a mask ROM as provided by the present invention, doping in the lower portion of the polysilicon BL forms an arched ion doping region, the closer the ions are to the openings of the sacrificial silicon oxide layer the higher the concentration. Conversely, the further away the ions are from the openings of the sacrificial silicon oxide layer, the lower the concentration. Since the BL is not completely buried in the substrate, thus the implantation of ion concentration can be increased without concern that the problem of a BL punch-through occurring, and thus lowers the BL resistance. Moreover, by utilizing the junction to distribute the ion concentration within the ion doping region, the high ion concentration in the shallow junction lowers junction resistance, the low ion concentration in the deep junction reduces leakage, and the ion concentration on the side junction prevents a punch-through from happening. As a result, according to the operation of the method of manufacturing as provided by the present invention, the measurements of the mask ROM can be shrunk to approximately $0.35\mu$, and thus makes a great contribution to the increasing the integration rate of the mask ROM.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of manufacturing a mask ROM bit line (BL), comprising:

providing a substrate, upon which at least is formed an active region;

forming a sacrificial silicon oxide layer on the active region;

patterning the sacrificial silicon oxide layer in order to form a plurality of parallel openings and expose a part of the active region;

forming a polysilicon layer on the sacrificial silicon oxide layer and the openings, wherein the polysilicon layer is filled with these openings;

performing an ion implantation process on the polysilicon layer, wherein a plurality of ions are implanted into the polysilicon layer;

performing a thermal flow process, the ions within the polysilicon layer are driven through the openings into the lower portion of the substrate, thereby forming a plurality of ion doping regions;

etching back of the polysilicon layer until the sacrificial silicon oxide layer is exposed; and removing the sacrificial silicon oxide layer.

2. The method of manufacturing the mask ROM BL as defined in claim 1, wherein the step of forming the openings includes anisotropic etching.

3. The method of manufacturing the mask ROM BL as defined in claim 1, wherein the step of forming the openings includes reactive ion etching.

4. The method of manufacturing the mask ROM BL as defined in claim 1, wherein the thickness of the polysilicon layer is from about 1000 Å to 3000 Å.

5. The method of manufacturing the mask ROM BL as defined in claim 1, wherein the thickness of the polysilicon layer is from about 1500 Å to 2000 Å.

6. The method of manufacturing the mask ROM BL as defined in claim 1, the concentration of the ion implantation is from about $10^{14}$ to $10^{17}$ atoms/cm$^2$.

7. The method of manufacturing the mask ROM BL as defined in claim 1, the concentration of the ion implantation is from about $10^{15}$ to $10^{16}$ atoms/cm$^2$.

8. A method of manufacturing a mask ROM, comprising:

providing a substrate, upon which at least is formed an active region;

forming a sacrificial silicon oxide layer on the active region;

patterning the sacrificial silicon oxide layer in order to form a plurality of parallel openings and expose a part of the active region;

forming a first polysilicon layer on the sacrificial layer, wherein the openings are filled with the first polysilicon layer;

performing an ion implantation process on the first polysilicon layer, wherein a plurality of ions are implanted into the polysilicon layer;

performing a thermal flow process upon the implanted ions, wherein the ions within the polysilicon layer are driven through the openings into the lower portion of the substrate, thereby forming a plurality of ion doping regions;

etching back of the polysilicon layer until the sacrificial silicon oxide layer is exposed;

removing the sacrificial silicon oxide layer;

forming a gate oxide layer, a second polysilicon layer and a silicide layer on the substrate and on the surface of the first polysilicon layer; and patterning the silicide layer and the second polysilicon layer, in order to form a plurality of parallel gates, wherein the gates and the ion doping region are roughly perpendicular.

9. The method of manufacturing the mask ROM as defined in claim 8, wherein the thickness of the first polysilicon layer is from about 1000 Å to 3000 Å.

10. The method of manufacturing the mask ROM as defined in claim 8, wherein the thickness of the first polysilicon layer is from about 1500 Å to 2000 Å.

11. The method of manufacturing the mask ROM as defined in claim 8, the concentration of the implanted ions in the first polysilicon layer is from about $10^{14}$ to $10^{17}$ atoms/cm$^2$.

12. The method of manufacturing the mask ROM as defined in claim 8, wherein the concentration of the implanted ions in the first polysilicon layer is from about $10^{15}$ to $10^{16}$ atoms/cm$^2$.

13. The method of manufacturing the mask ROM as defined in claim 8, the step of forming the silicide layer includes a low pressure chemical vapor deposition (LPCVD).

14. The method of manufacturing the mask ROM as defined in claim 8, wherein the material of the silicide layer comprises of tungsten silicide.

15. The method of manufacturing the mask ROM as defined in claim 8, the step of forming these gates includes an anisotropic etching process.

16. The method of manufacturing the mask ROM as defined in claim 8, the step of forming these gates includes a reactive ion etching (RIE) process.

* * * * *